(12) United States Patent
Fujieda

(10) Patent No.: US 8,254,193 B2
(45) Date of Patent: Aug. 28, 2012

(54) SEMICONDUCTOR MEMORY DEVICE

(75) Inventor: Waichiro Fujieda, Miyazaki (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 133 days.

(21) Appl. No.: 12/923,981

(22) Filed: Oct. 19, 2010

(65) Prior Publication Data

US 2011/0090752 A1  Apr. 21, 2011

(30) Foreign Application Priority Data

Oct. 21, 2009  (JP) .................................. 2009-242615

(51) Int. Cl.
*G11C 7/00* (2006.01)
(52) U.S. Cl. ....................... 365/203; 365/204
(58) Field of Classification Search .................. 365/203, 365/204
See application file for complete search history.

(56) References Cited

U.S. PATENT DOCUMENTS

| 6,130,846 | A  | * | 10/2000 | Hori et al. ...................... 365/203 |
| 6,310,808 | B1 | * | 10/2001 | Tanizaki ....................... 365/203 |
| 6,504,776 | B1 | * | 1/2003  | Nakaoka ....................... 365/203 |
| 6,781,903 | B2 | * | 8/2004  | Mangyo et al. ............... 365/203 |

FOREIGN PATENT DOCUMENTS

| JP | 2006-040431 A | 2/2006 |
| JP | 2006-228294 A | 8/2006 |

* cited by examiner

*Primary Examiner* — Son Dinh
(74) *Attorney, Agent, or Firm* — Rabin & Berdo, P.C.

(57) ABSTRACT

There is provided a semiconductor memory device including: plural memory cells; a selection signal outputting section; a first precharging section that precharges a potential of a data line that outputs, to an exterior, a signal of a level corresponding to data stored in the memory cell; and a bit line selecting section that has, per bit line, a bit line selecting section that comprises (1) a second precharging section, (2) a potential lowering section, and (3) a third precharging section connected to the bit line selection line and the bit line between the second precharging section and a connection point at which the potential lowering section is connected to the bit line, and when the non-selection signal is inputted, the third precharging section precharges the bit line between the second precharging section and the connection point at which the potential lowering section is connected to the bit line.

5 Claims, 4 Drawing Sheets

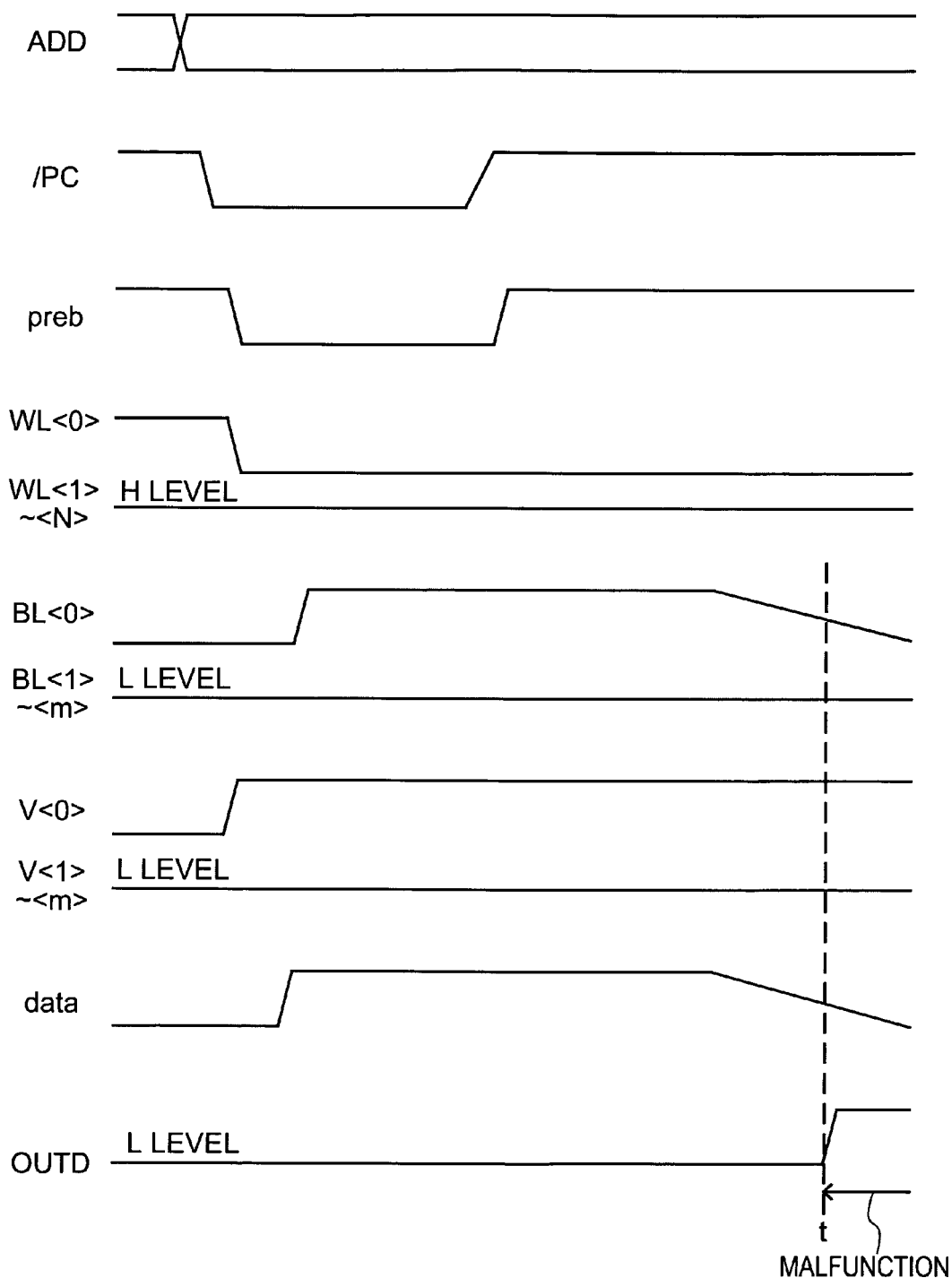

SEMICONDUCTOR MEMORY DEVICE

CROSS-REFERENCE TO RELATED APPLICATION

This application is based on and claims priority under 35 USC 119 from Japanese Patent Application No. 2009-242615 filed on Oct. 21, 2009, the disclosure of which is incorporated by reference herein.

BACKGROUND

1. Technical Field

The present invention relates to a semiconductor memory device, and in particular, to a semiconductor memory device that uses a bit line precharge method.

2. Related Art

In a semiconductor memory device such as a memory or the like, generally, there are cases in which various types of leakage current arise at the interior of the semiconductor memory device. Due to leakage current arising, problems such as an increase in consumed electric power, and the like, arise.

Therefore, there are techniques that suppress leakage current. For example, Japanese Patent Application Laid-Open (JP-A) No. 2006-040431 discloses a technique of suppressing an increase in consumed electric power by suppressing sub-threshold current of a MOSFET, that is leakage current that arises in a semiconductor integrated circuit device such as an SRAM (static RAM) that is a volatile memory, or the like.

Further, JP-A No. 2006-228294 discloses a technique of reducing consumed electric power by reducing leakage current that flows from bit lines into memory cells due to precharging of the bit lines at the time of accessing the memory cells, which current is leakage current that arises in a semiconductor memory device using a bit line precharge method such as an SRAM or the like.

On the other hand, there are cases in which leakage current, that flows into bit lines from signal lines that are for outputting, to the exterior, signals (stored data) that are read-out from memory cells, arises in a semiconductor memory device.

FIG. 3 illustrates an example of the schematic structure of a NAND-type mask ROM that is a non-volatile memory, as a concrete example of a semiconductor memory device that uses a conventional bit line precharge method.

A conventional semiconductor memory device 100 is structured to include an input buffer circuit 112, a control circuit 114, a row decoder circuit 116, a column decoder circuit 118, a memory cell array 120, a bit line selection circuit 122, and an AMP circuit 124.

The memory cell array 120 includes (m+1)×(n+1) NMOS transistors 130, that are arrayed in m+1 rows and n+1 columns and structure memory cells, and m+1 NMOS transistors 131 for precharging. Note that, when referring to the NMOS transistors 130 generically without distinguishing among the individual transistors, they are simply called the NMOS transistors 130, and when designating the NMOS transistor 130 that is disposed in the ith row and the jth column, it is called the NMOS transistor 130<i,j>. Similarly, when referring generically to the NMOS transistors 131 for precharging, they are simply called the NMOS transistors 131 for precharging, and when designating the NMOS transistor 131 for precharging that is disposed in the jth column, it is called the NMOS transistor 131<j> for precharging.

The bit line selection circuit 122 is for selecting any one of bit lines BL<0> through BL<m> on the basis of inputted bit line selection signals V<0> through V<m>, and includes m+1 bit line selection circuits 123.

An external control signal/PC that is inputted from the exterior of the semiconductor memory device 100 is inputted to the control circuit 114 via the input buffer circuit 112. In accordance with the inputted external control signal/PC, the control circuit 114 generates a bit line precharge control signal preb that is a control signal for precharging the bit line BL, and outputs the bit line precharge control signal preb to the NMOS transistor 131 for precharging and to the gate of a PMOS transistor 144 for precharging the bit line BL.

At the PMOS transistor 144, the source is connected to a power supply, and the drain is connected to a data line data for outputting data signals from the bit line selection circuit 123 to the AMP circuit 124. When the bit line precharge control signal preb is "L" level, the PMOS transistor 144 is in an on state, and, by applying voltage to the data line data, precharges the one bit line BL that is selected by the bit line selection circuit 123.

An external address signal ADD that is inputted from the exterior of the semiconductor memory device 100 is inputted to the row decoder circuit 116 and the column decoder circuit 118 via the input buffer circuit 112.

On the basis of the inputted external address signal ADD, the row decoder circuit 116 generates word line signals WL<0> through WL<n>, and outputs them from respective word lines WL<0> through WL<n> to the memory cell array 120. The word line signals WL<0> through WL<n> express non-selection when "H" level, and express selection when "L" level.

The word lines WL<0> through WL<n> are connected to the gates of the NMOS transistors 130 of the memory cell array 120. At the NMOS transistor 130 whose source and drain are shorted, current flows from the drain to the source even when the word line signal WL is "L" level. On the other hand, at the NMOS transistor 130 whose source and drain are not shorted, current does not flow when the word line signal WL is "L" level.

On the basis of the inputted external address signal ADD, the column decoder circuit 118 generates the bit line selection signals V<0> through V<m>, and outputs them from bit line selection lines V<0> through V<m> to the corresponding bit line selection circuits 123 of the bit line selection circuit 122.

The bit line selection circuit 122 has the bit line selection circuit 123 for each of the bit lines BL, and, on the basis of the inputted bit line selection signals V<0> through V<m>, selects the one of the bit lines BL<0> through BL<m> that corresponds to the address, and connects the selected bit line to the AMP circuit 124.

The reading-out operations of the conventional semiconductor memory device 100 are described next. FIG. 4 is an example of a timing chart of the reading-out operations at the semiconductor memory device 100. Note that FIG. 4 shows, as a concrete example, a case in which the external address signal ADD instructs address <0,0> (a case in which the address <0,0> is read-out).

The external control signal/PC is inputted from the exterior to the input buffer circuit 112. When the external control signal/PC is inputted from the input buffer circuit 112, the control circuit 114 generates the bit line precharge control signal preb. When the bit line precharge control signal preb is "L" level, the gate of the PMOS transistor 144 is turned on, and is precharged, and the data line signal data becomes "H" level. Further, the gate of the NMOS transistor 131 for precharging turns off.

The one bit line BL<0> through BL<m>, that is selected by the external address signal ADD that was inputted from the exterior to the column decoder circuit 118 via the input buffer circuit 112, is precharged to "H" level. FIG. 4 shows a case in which the bit line selection signal V<0> is "H" level, the bit line selection signals V<1> through V<m> are "L" level, and the bit line BL<0> is selected.

Further, one of the word line signals WL<0> through WL<n> is selected at the row decoder circuit 116 in accordance with the external address signal ADD. FIG. 4 shows a case in which the word line signal WL<0> is "L" level, the word line signals WL<1> through WL<n> are "H" level, and the word line signal WL<0> is selected. When the external control signal/PC becomes "H" level, the precharging operation finishes, and the reading-out operation starts.

Because the source and the drain of the NMOS transistor 130<0,0> are not shorted, current does not flow to the NMOS transistor 130<0,0>, and the bit line signal BL<0> is maintained at "H" level. Accordingly, an external output signal OUTD that is outputted from the AMP circuit 124 is "L" level.

However, when the time period over which the external control signal/PC is "H" level becomes long, there is the problem that, due to leakage current that flows-in from the data line signal data to the bit line signal BL, the precharge level of the data line signal data cannot be maintained, the output level of the external output signal OUTD inverts, and malfunctioning occurs.

In the state in which the bit line selection signal V<0> is "H" level and the bit line selection signals V<1> through V<m> are "L" level, at the bit line selection circuit 123<0>, an NMOS transistor 134<0> that is connected to the data line data and the bit line BL<0> is in an on state, and an NMOS transistor 136<0> is in an off state. On the other hand, at the bit line selection circuits 123<1> through 123<m>, the NMOS transistors 134<1> through 134<m> are in off states, and the NMOS transistors 136<1> through 136<m> are in on states.

At the NMOS transistors 134<1> through 134<m> of the bit line selection circuits 123<1> through 123<m>, because the data line signal data is "H" level and the bit line signals BL<1> through BL<m> are "L" level, leakage current arises due to the potential difference between the both. Namely, leakage current flows from the data line data into the bit lines BL<1> through <m>. When, due to the occurrence of leakage current, the potential of the data line signal data decreases and the bit line signal BL<0> cannot maintain the precharge level ("H" level) and the voltage of the data line signal data falls below the threshold value of the AMP circuit 124, the level of the external output signal OUTD inverts from "L" level to "H" level, and malfunctioning occurs. In FIG. 4, when timing t is reached, due to the drop in the voltage of the data line signal data, the signal level of the external output signal OUTD inverts and malfunctioning occurs.

In particular, when the number m of rows becomes large, the number of bit line selection circuits 123 at which leakage current is generated also becomes large, and therefore, the leakage current increases. Thus, it is easy for the voltage of the data line signal data to decrease to below the threshold value of the AMP circuit 124, and it is easy for malfunctioning to occur.

SUMMARY

The present invention is proposed in order to overcome the above-described problems, and an object thereof is to provide a semiconductor memory device that can suppress leakage current that flows into a bit line from a signal line that is for outputting read-out signals to the exterior.

In order to achieve the above-described object, a first aspect of the present invention provides a semiconductor memory device including:

plural memory cells that are disposed in a matrix form, and from which data is read-out by bit lines that are provided per column of the matrix form;

a selection signal outputting section that outputs a selection signal to any one bit line selection line among bit line selection lines that are provided per bit line respectively, and outputs non-selection signals to other bit line selection lines;

a first precharging section that precharges a potential of a data line that outputs, to an exterior, a signal of a level corresponding to data stored in the memory cell; and a bit line selecting section that has, per bit line, a bit line selecting section that comprises (1) a second precharging section that is provided between the bit line and the data line and to which the bit line selection line is connected, and when the selection signal is inputted, the second precharging section makes the bit line and the data line be conductive and precharges a potential of the bit line by the potential of the data line that was precharged by the first precharging section, and when the non-selection signal is inputted, the second precharging section does not make the bit line and the data line be conductive, (2) a potential lowering section that is connected to the bit line and the bit line selection line, and when the non-selection signal is inputted, the potential lowering section makes the potential of the bit line be lower than the potential of the data line that was precharged by the first precharging section, and (3) a third precharging section that is connected to the bit line selection line and the bit line between the second precharging section and a connection point at which the potential lowering section is connected to the bit line, and when the non-selection signal is inputted, the third precharging section precharges the bit line between the second precharging section and the connection point at which the potential lowering section is connected to the bit line.

A second aspect of the present invention provides the semiconductor memory device of the first aspect, wherein, when the non-selection signal is inputted, the third precharging section precharges the bit line, between the second precharging section and the connection point at which the potential lowering section is connected to the bit line, to a potential of a same level as the potential of the data line that was precharged by the first precharging section.

A third aspect of the present invention provides the semiconductor memory device of the first aspect, wherein the second precharging section is a first transistor that conducts current when the selection signal is inputted and does not conduct current when the non-selection signal is inputted, and the potential lowering section is a second transistor that maintains potential when the selection signal is inputted and lowers potential when the non-selection signal is inputted, and the third precharging section precharges between the first transistor and a connection point at which the second transistor is connected to the bit line.

A fourth aspect of the present invention provides the semiconductor memory device of the third aspect, wherein the third precharging section has (1) a third transistor that is connected in series to the first transistor, and to which the bit line selection line is connected, and that conducts current when the selection signal is inputted, and that does not conduct current when the non-selection signal is inputted, and (2) a fourth transistor that is connected between the first transistor and the third transistor, and to which the bit line selection line is connected, and that does not precharge between the first transistor and the third transistor when the selection signal is inputted, and that precharges between the first transistor and the transistor when the non-selection signal is inputted.

A fifth aspect of the present invention provides the semiconductor memory device of the first aspect, further including an amplifying section that amplifies the potential of the data line and outputs to an exterior.

In accordance with the present invention, there is the effect that it is possible to suppress leakage current that flows into a bit line from a signal line that is for outputting read-out signals to the exterior.

BRIEF DESCRIPTION OF THE DRAWINGS

An exemplary embodiment of the present invention will be described in detail based on the following figures, wherein:

FIG. 4 is a timing chart for explaining operations of reading-out data that is stored in a memory cell at the conventional semiconductor memory device.

DETAILED DESCRIPTION

Figure 1:
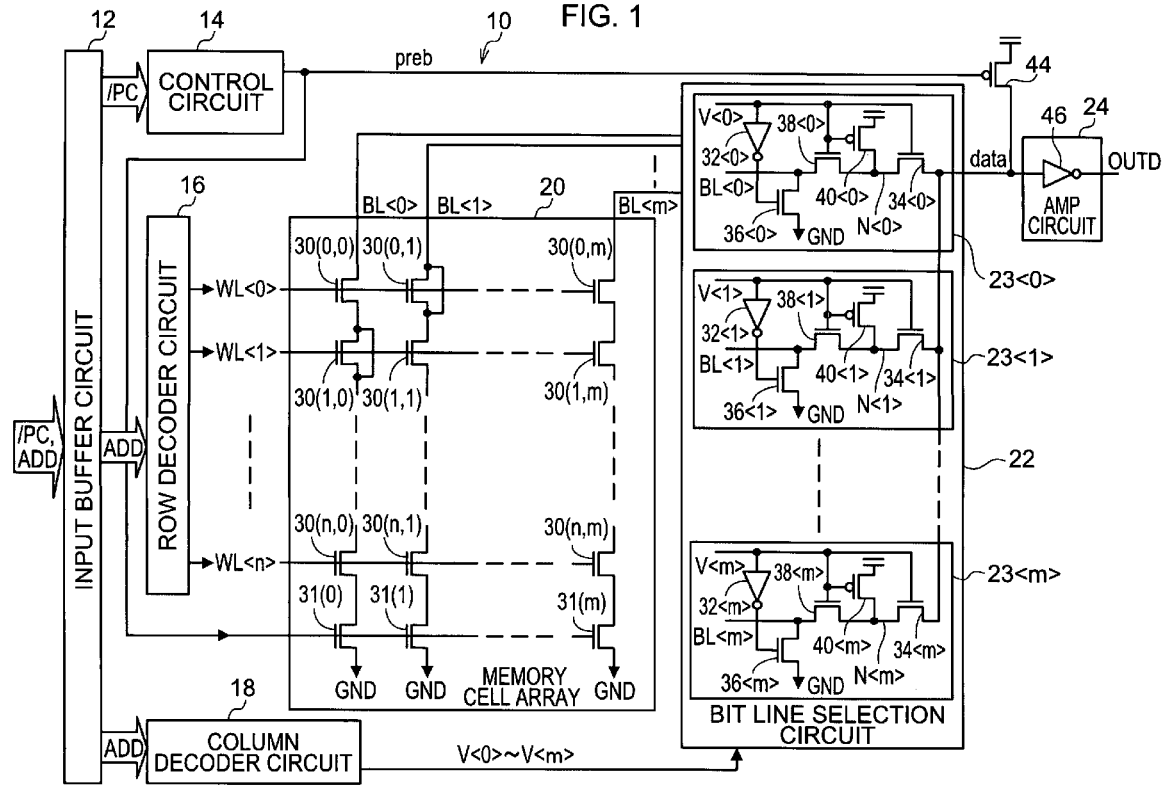
FIG. 1 is a schematic structural drawing showing an example of the schematic structure of a semiconductor memory device relating to an exemplary embodiment.

A semiconductor memory device of an exemplary embodiment of the present invention is described in detail hereinafter with reference to the drawings. FIG. 1 is a schematic structural drawing showing an example of the schematic structure of the semiconductor memory device of the present exemplary embodiment. A case is illustrated in which a semiconductor memory device 10 of the present exemplary embodiment is a mask ROM as a concrete example of a semiconductor memory device. Note that, in the following description, the names of the signal lines and the names of the signals flowing through those signal lines are the same. Further, when referring to an individual circuit, signal line, signal or the like, the reference numeral for individual identification will be added as "< >" (e.g., "<0>", "<m>" or the like), and such reference numerals are omitted in generic designation.

The semiconductor memory device 10 is structured to include an input buffer circuit 12, a control circuit 14, a row decoder circuit 16, a column decoder circuit 18, a memory cell array 20, a bit line selection circuit 22, an AMP circuit 24, and a PMOS transistor 44.

The memory cell array 20 includes (m+1)×(n+1) NMOS transistors 30, that are arrayed in m+1 rows and n+1 columns and structure memory cells, and NMOS transistors 31 for precharging. Note that, when referring to the NMOS transistors 30 generically without distinguishing among the individual transistors, they are simply called the NMOS transistors 30, and when designating the NMOS transistor 30 that is disposed in the ith row and the jth column, the reference numeral indicating the position thereof is added, and it is called the NMOS transistor 30<i,j>.

The semiconductor memory device 10 of the present exemplary embodiment is a mask ROM, and is structured such that, at the NMOS transistors 30 in which data is stored ("1" is stored), the source and the drain are shorted, and, at the NMOS transistors 30 at which data is not stored ("0" is stored), the source and the drain are not shorted.

In the semiconductor memory device 10 of the present exemplary embodiment, an external control signal/PC, that is inputted from the exterior of the semiconductor memory device 10, is inputted to the control circuit 14 via the input buffer circuit 12. The external control signal/PC is a signal that controls the timing of precharging a data line data that is for outputting data signals from the bit line selection circuit 22 to the AMP circuit 24. In accordance with the inputted external control signal/PC, the control circuit 14 generates a bit line precharge control signal preb that is a control signal for precharging a bit line BL, and outputs the bit line precharge control signal preb to the gate of the PMOS transistor 44, that is for precharging the bit line BL, and to the gate of the NMOS transistor 31 for precharging. The bit line precharge control signal preb is a control signal that controls such that precharging is carried out when the bit line precharge control signal preb is "L" level and precharging is not carried out when the bit line precharge control signal preb is "H" level.

The source of the PMOS transistor 44 is connected to a power supply, and the drain is connected to the data line data. When the bit line precharge control signal preb is "L" level, the PMOS transistor 44 is on, and applies voltage to the data line data, and precharges to "H" level.

Further, at the semiconductor memory device 10 of the present exemplary embodiment, an external address signal ADD that is inputted from the exterior of the semiconductor memory device 10 is inputted to the row decoder circuit 16 and the column decoder circuit 18 via the input buffer circuit 12. The external address signal ADD is a signal expressing the address (the row and column) of the NMOS transistor 30 that is to be selected (that is to be accessed in order to read-out stored information in the present exemplary embodiment).

The external address signal ADD is inputted to the row decoder circuit 16. On the basis of the inputted external address signal ADD, the row decoder circuit 16 generates word line signals WL<0> through WL<n>, and outputs them to the memory cell array 20 from respective word lines WL<0> through WL<n>. In the case of non-selection, the word line signal WL is a non-selection signal that is "H" level, and, in the case of selection, the word line signal WL is a selection signal that is "L" level. Accordingly, among the n+1 word lines WL<0> through WL<n>, the one signal level that is selected is "L" level, and the n signal levels that are not selected are "H" level.

The word lines WL are connected to the gates of the NMOS transistors 30 of the memory cell array 20. At the NMOS transistor 30 at which the source and the drain are shorted, current flows form the drain to the source even when the word line signal WL is "L" level. On the other hand, at the NMOS transistor 30 at which the source and the drain are not shorted, current does not flow when the word line signal WL is "L" level. Note that FIG. 1 illustrates, as a concrete example, a case in which the sources and the drains of the NMOS transistor 30<0,1> and the NMOS transistor 30<1,0> are shorted.

On the basis of the inputted external address signal ADD, the column decoder circuit 18 generates bit line selection signals V<0> through V<m>, and outputs them to the corresponding bit line selection circuits 23<0> through 23<m> respectively from bit line selection lines V<0> through V<m>. In the case of selection, the bit line selection signal V is a selection signal that is "H" level, and, in the case of non-selection, the bit line selection signal V is a non-selection signal that is "L" level. Accordingly, among the m+1 bit line selection lines V<0> through V<m>, the one signal level that is selected is "H" level, and the m signal levels that are not selected are "L" level.

The bit line selection circuit 22 is for selecting one of the bit lines BL<0> through BL<m>, on the basis of the inputted bit line selection signals V<0> through V<m>. The bit line selection circuit 22 selects the one bit line BL corresponding to the address, and connects the selected bit line BL and the AMP circuit 24 by making the selected bit line BL and the data line data be conductive. The bit line selection circuit 22 has the bit line selection circuit 23 for each bit line BL.

The bit line selection circuit 23 is structured to include an inverter 32, an NMOS transistor 34, an NMOS transistor 36, an NMOS transistor 38, and a PMOS transistor 40.

The NMOS transistor 36 is connected to the bit line BL, and further, the bit line selection line V is connected to the gate via the inverter 32. The NMOS transistor 34 and the NMOS transistor 38 are connected in series, and the bit line selection line V is connected to the respective gates thereof. The side of the NMOS transistor 34, which side is not connected to the NMOS transistor 38, is connected to the data line data. Further, the side of the NMOS transistor 38, which side is not connected to the NMOS transistor 34, is connected to the bit line BL. The source of the PMOS transistor 40 is connected to a power supply, and the drain is connected to a node N that is between the NMOS transistor 34 and the NMOS transistor 38. The gate is connected to the bit line selection line V.

When the bit line selection signal V is the selection signal that is "H" level, the NMOS transistor 36 and the PMOS transistor 40 turn off, and, on the other hand, the NMOS transistor 34 and the NMOS transistor 38 turn on. Accordingly, the bit line BL and the data line data are made to be conductive.

When the bit line selection signal V is the non-selection signal that is "L" level, the NMOS transistor 36 and the PMOS transistor 40 turn on, and, on the other hand, the NMOS transistor 34 and the NMOS transistor 38 turn off. Accordingly, the bit line BL and the data line data are not made conductive, and the node between the NMOS transistor 34 and the NMOS transistor 38 is precharged to "H" level by the voltage that is supplied from the power supply of the PMOS transistor 40.

The AMP circuit 24 of the semiconductor memory device 10 includes an amplifier 46 such as a sense amplifier or the like. The AMP circuit 24 outputs an external output signal OUTD, that is obtained by amplifying the data line signal data that is inputted from the data line data, to the exterior of the semiconductor memory device 10 from an external output line OUTD.

The reading-out operations of the semiconductor memory device 10 of the present exemplary embodiment are described next.

Because the semiconductor memory device 10 of the present exemplary embodiment is a mask ROM, a summary of the reading-out operations is as follows. The data line data is precharged by the bit line precharge control signal preb that is generated on the basis of the external control signal/PC. Next, the one bit line BL, that is selected by the bit line selection circuit 23 in accordance with the bit line selection signals V that are generated on the basis of the external address signal ADD, is precharged. The word line signals WL, that are generated on the basis of the external address signal ADD, are generated. If the drain and the source of the NMOS transistor 30 that is selected by the bit line signals BL and the word line signals WL are shorted, current flows between the source and the drain, and current flows through the memory cell array 20 and drops to ground, and therefore, the signal level of the inputted bit line signal BL becomes "L" level from "H" level. On the other hand, if the drain and the source of the selected NMOS transistor 30 are not shorted, current does not flow, and the signal level ("H" level) of the inputted bit line signal BL is maintained.

Figure 2:
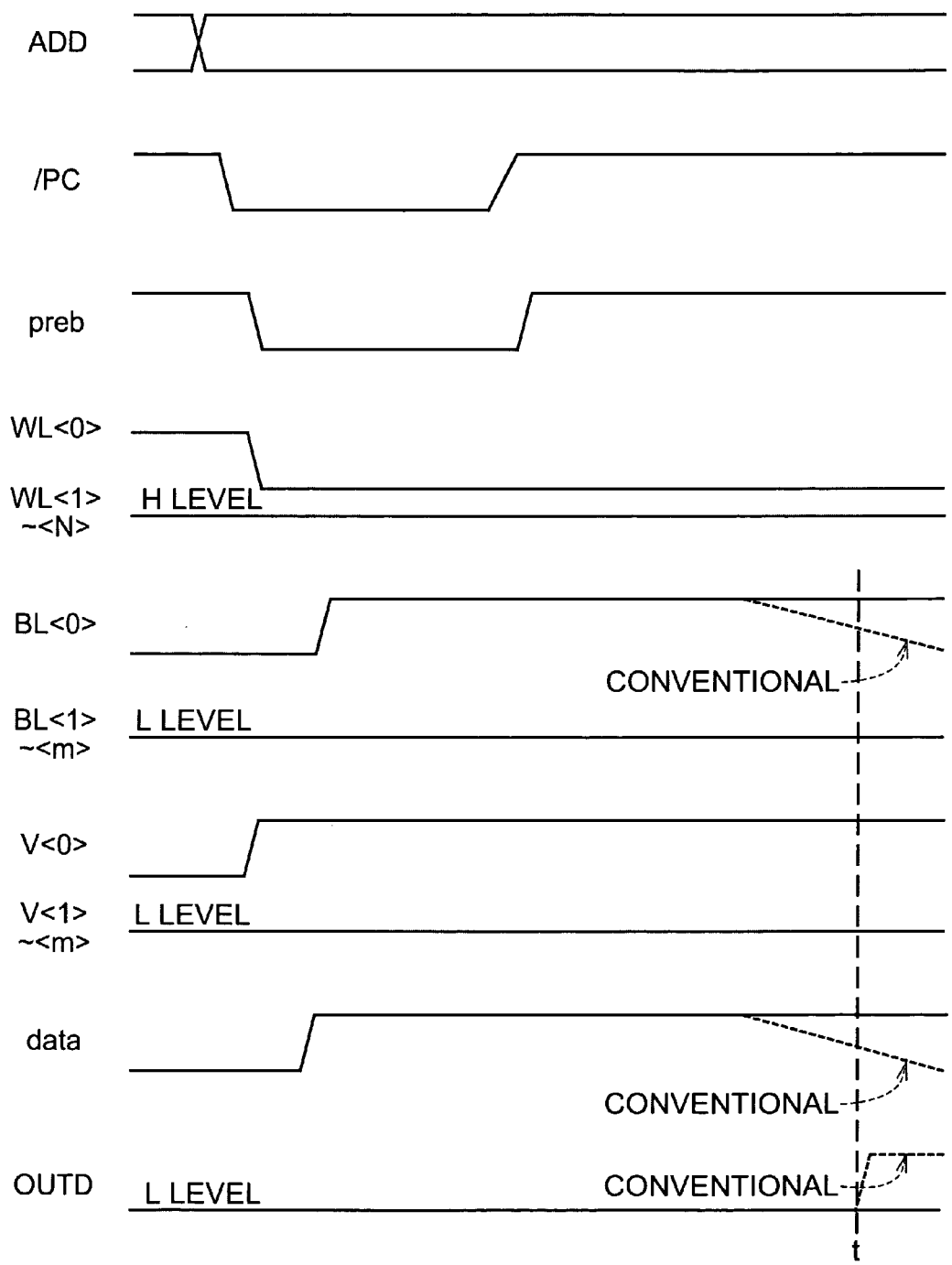
FIG. 2 is a timing chart for explaining operations of reading-out data that is stored in a memory cell at the semiconductor memory device relating to the exemplary embodiment.

FIG. 2 is an example of a timing chart of the reading-out operations at the semiconductor memory device 10. Note that FIG. 2 illustrates, as a concrete example, a case in which the external address signal ADD instructs address <0,0>, i.e., a case of reading-out the data stored in the NMOS transistor 30<0,0>.

The external control signal/PC is inputted to the input buffer circuit 12 from the exterior. When the external control signal/PC is inputted from the input buffer circuit 12, the control circuit 14 generates the bit line precharge control signal preb. In FIG. 2, the generated bit line precharge control signal preb also changes from "H" level to "L" level in accordance with the inputted external control signal/PC changing from "H" level to "L" level. Note that the time period over which the bit line precharge control signal preb is "L" level corresponds to the precharge time period of the data line data (the bit line signal BL).

When the bit line precharge control signal preb changes to "L" level, the PMOS transistor 44 turns on, and further, the NMOS transistor 31 for precharging turns off. Voltage is supplied to the data line data from the power supply connected to the source, and the data line data is precharged to "H" level. Due thereto, the data line signal data changes from "L" level to "H" level.

On the other hand, the external address signal ADD is inputted to the row decoder circuit 16 and the column decoder circuit 18 via the input buffer circuit 12. On the basis of the external address signal ADD, the column decoder circuit 18 generates the bit line selection signals V and outputs them to the bit line selection circuit 22. Note that, in the present exemplary embodiment, the bit line selection signal V<0> is the selection signal that is "H" level, and the bit line selection signals V<1> through V<m> are non-selection signals that are "L" level.

At the bit line selection circuit 23<0> to which the bit line selection signal V<0> is inputted, the NMOS transistor 34 and the NMOS transistor 38 turn on, and the NMOS transistor 36 and the PMOS transistor 40 turn off. Due thereto, the data line data and the bit line signal BL<0> become connected, and the potential that was precharged to the data line data flows into the bit line BL<0> via the NMOS transistor 34 and the NMOS transistor 38. Therefore, the bit line BL<0> is precharged and becomes "H" level.

On the other hand, at the bit line selection circuits 23<1> through 23<m> to which the bit line selection signals V<1> through V<m> are inputted, the NMOS transistor 34 and the NMOS transistor 38 turn off, and the NMOS transistor 36 and the PMOS transistor 40 turn off. Due thereto, the data line data and the bit lines BL<1> through BL<m> are set in non-connected states, and the potential that was precharged to the data line data does not flow into the bit lines BL<1> through BL<m>. Therefore, the bit lines BL<1> through BL<m> maintain "L" levels without being precharged.

Further, at the bit line selection circuits 23<1> through 23<m>, because the PMOS transistors 40 are on, potential is supplied from the power supply to the nodes N<1> through N<m>. In the present exemplary embodiment, potential is supplied from the power supply that is connected to the sources of the PMOS transistors 40, so as to become the same potential as the potential that is precharged to the data line data. Note that, because the NMOS transistors 38 are off, the nodes N<1> through N<m>, and the bit lines BL<1> through BL<m>, are not connected, but there are cases in which leakage current arises from the nodes N<1> through N<m> to the bit lines BL<1> through BL<m> due to the potential difference. However, the current amount of the leakage current that is generated at the one bit line selection circuit 23 is small, and potential is always supplied from the power supply of the PMOS transistors 40 to the nodes N<1> through N<m>. Therefore, the problem of a drop in potential of the nodes N<1> through N<m> due to leakage current does not arise. In this way, the potential of the nodes N<1> through N<m> is maintained at "H" level, which is the same as the data line signal data.

Next, when the inputted external control signal/PC becomes "H" level from "L" level, accompanying this, the bit line precharge control signal preb, that is generated at and outputted from the control circuit 14, becomes "H" level from "L" level. When the "H" level bit line precharge control signal preb is inputted, the PMOS transistor 44 turns off and the NMOS transistor 31 for precharging turns on, and the precharging operation of the data line data is finished.

On the other hand, on the basis of the inputted external address signal ADD, the row decoder circuit 16 generates the word line signals WL and outputs them to the memory cell array 20. Note that, in the present exemplary embodiment, the word line signal WL<0> is the selection signal that is "L" level, and the bit line selection signals WL<1> through WL<n> are non-selection signals that are "H" level.

Due thereto, the NMOS transistors 30<0,0> through 30<0,m> of the memory cell array 20 turn off, and the NMOS transistors 30<1,0> through 30<n,m> turn on. Because the source and the drain of the NMOS transistor 30<0,0> are not shorted, current does not flow from the source to the drain, and current does not flow to the memory cell array 20. Accordingly, the "H" level of the bit line signal BL<0> is maintained. Note that, at this time, "L" level is maintained at the bit lines BL<1> through BL<m>.

Due to the bit line signal BL<0> being maintained at "H" level, the data line signal data also is maintained at "H" level. By the AMP circuit 24, the signal level of the "H" level data line signal data is inverted and the signal is amplified, and the exterior output signal OUTD that is "L" level is outputted to the exterior of the semiconductor memory device 10.

In the present exemplary embodiment, at the bit line selection circuits 23<1> through 23<m>, the data line signal data, and the nodes N<1> through N<m>, are both "H" level and are the same potential. Therefore, the potential difference between the source and the drain at the NMOS transistors 34<1> through 34<m> is 0, or is a slight difference to the extent that it can be considered to be 0. Therefore, leakage current that flows from the data line data into the nodes N<1> through N<m> (the bit lines BL<1> through <m>) does not arise. Further, at the bit line selection circuit 23<0>, the data line signal data, the node N<0> and the bit line signal <0> are all "H" level, and the potential difference between the source and the drain of the NMOS transistor 34<0> is 0, or is a slight difference to the extent that it can be considered to be 0. Therefore, leakage current that flows from the data line data into the node N<0> (the bit line BL<0>) does not arise.

Figure 3:
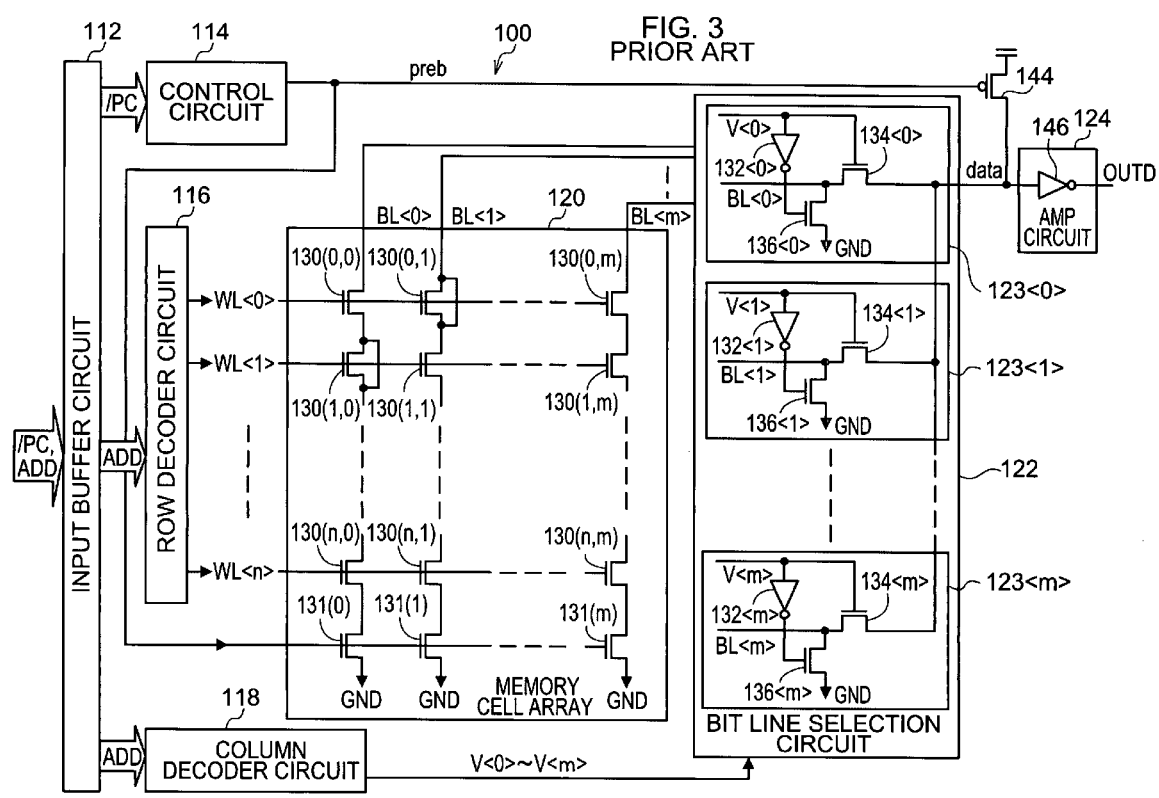
FIG. 3 is a schematic structural drawing showing an example of the schematic structure of a conventional semiconductor memory device.

At the semiconductor memory device 10, leakage current does not arise from the data line data to the bit lines BL, and the voltage of the data line signal data does not drop. Therefore, even when time t, at which malfunctioning occurs, has elapsed after the external address signal ADD changes in the case of the conventional semiconductor memory device 100 shown in FIGS. 3 and 4, the external output signal OUTD is not inverted, and malfunctioning is prevented. Even when the time period over which the external control signal/PC is "H" level is long, e.g., the reading-out operation time period is long, this leakage current does not arise. Accordingly, because the voltage of the data line signal data does not drop, malfunctioning is prevented.

As described above, in the semiconductor memory device 10 of the present exemplary embodiment, the NMOS transistor 38 and the PMOS transistor 40, to which the bit line selection signal V is inputted, are provided between the NMOS transistor 34 and the NMOS transistor 36 as portions that precharge the node therebetween. Concretely, the NMOS transistor 38 is connected in series to the NMOS transistor 34, the source of the PMOS transistor 40 is connected to a power supply, and the drain is connected to the node N between the NMOS transistor 34 and the NMOS transistor 38. Due thereto, when the data line signal data is precharged to "H" level, at the bit line selection circuit 23 to which is inputted the "L" level bit line selection signal V that is the non-selection signal, the node N is precharged to "H" level, and the potential difference between the source and the drain of the NMOS transistor 34 disappears. Therefore, leakage current that flows from the data line data into the bit line BL via the node N is prevented. Accordingly, because the voltage of the data line data does not drop, the signal level of the external output signal OUTD inverting from "L" level to "H" level and malfunctioning occurring can be prevented. In particular, even when the reading-out cycle (the reading-out time period) for reading-out information from the memory cell array 20 is long, a drop in the voltage of the data line data due to leakage current is prevented regardless of the number of columns (m) of the memory cell array 20. Therefore, malfunctioning of the external output signal OUTD can be prevented.

Note that the present exemplary embodiment describes in detail a case in which the semiconductor memory device 10 is a mask ROM. However, the semiconductor memory device is not limited to the same provided that it is semiconductor memory device of a bit line precharge method that carries out bit line precharging at the time of accessing memory cells, and may be, for example, an SRAM, a DRAM, a programmable ROM, a flash memory, or the like.

Further, in the present exemplary embodiment, the NMOS transistor 38 and the PMOS transistor 40 are provided as precharging portions between the NMOS transistor 34 and the NMOS transistor 36, but the precharging portions are not limited to the same. Provided that there is a structure that can precharge the node at the side of the NMOS transistor 34, which side is not connected to the data line, to the same potential ("H" level) as the data line when the bit line selection signal V that is a non-selection signal is inputted to the bit line selection circuit 23, the precharging portions are not limited, and can be changed appropriately.

Moreover, the bit line precharging control signal preb, the word line signal WL, the bit line signal BL and the bit line selection signal V are not limited to the signal structures and the numbers of signals described in the present exemplary embodiment, and can be appropriately changed within a scope that does not deviate from the present invention. Further, the circuit structures of the input buffer circuit 12, the control circuit 14, the row decoder circuit 16, the memory cell array 20, the bit line selection circuit 22, the bit line selection circuit 23, the AMP circuit 24, and the PMOS transistor 44 are examples, and can be changed appropriately within a scope that does not deviate from the present invention.

What is claimed is:

1. A semiconductor memory device comprising:
a plurality of memory cells that are disposed in a matrix form, and from which data is read-out by bit lines that are provided per column of the matrix form;
a selection signal outputting section that outputs a selection signal to any one bit line selection line among bit line selection lines that are provided per bit line respectively, and outputs non-selection signals to other bit line selection lines;
a first precharging section that precharges a potential of a data line that outputs, to an exterior, a signal of a level corresponding to data stored in the memory cell; and
a bit line selecting section that has, per bit line, a bit line selecting section that comprises
  (1) a second precharging section that is provided between the bit line and the data line and to which the bit line selection line is connected, and when the selection signal is inputted, the second precharging section makes the bit line and the data line be conductive and precharges a potential of the bit line by the potential of the data line that was precharged by the first precharging section, and when the non-selection signal is inputted, the second precharging section does not make the bit line and the data line be conductive,
  (2) a potential lowering section that is connected to the bit line and the bit line selection line, and when the non-selection signal is inputted, the potential lowering section makes the potential of the bit line be lower than the potential of the data line that was precharged by the first precharging section, and
  (3) a third precharging section that is connected to the bit line selection line and the bit line between the second precharging section and a connection point at which the potential lowering section is connected to the bit line, and when the non-selection signal is inputted, the third precharging section precharges the bit line between the second precharging section and the connection point at which the potential lowering section is connected to the bit line.

2. The semiconductor memory device of claim 1, wherein, when the non-selection signal is inputted, the third precharging section precharges the bit line, between the second precharging section and the connection point at which the potential lowering section is connected to the bit line, to a potential of a same level as the potential of the data line that was precharged by the first precharging section.

3. The semiconductor memory device of claim 1, wherein the second precharging section is a first transistor that conducts current when the selection signal is inputted and does not conduct current when the non-selection signal is inputted, and the potential lowering section is a second transistor that maintains potential when the selection signal is inputted and lowers potential when the non-selection signal is inputted, and the third precharging section precharges between the first transistor and a connection point at which the second transistor is connected to the bit line.

4. The semiconductor memory device of claim 3, wherein the third precharging section has (1) a third transistor that is connected in series to the first transistor, and to which the bit line selection line is connected, and that conducts current when the selection signal is inputted, and that does not conduct current when the non-selection signal is inputted, and (2) a fourth transistor that is connected between the first transistor and the third transistor, and to which the bit line selection line is connected, and that does not precharge between the first transistor and the third transistor when the selection signal is inputted, and that precharges between the first transistor and the transistor when the non-selection signal is inputted.

5. The semiconductor memory device of claim 1, further comprising an amplifying section that amplifies the potential of the data line and outputs to an exterior.

* * * * *